(12) United States Patent
Spears et al.

(10) Patent No.: US 7,372,326 B1
(45) Date of Patent: May 13, 2008

(54) RADIO FREQUENCY PARALLEL AMPLIFIER

(75) Inventors: Edward T. Spears, Gilbert, AZ (US); Douglas A. Teeter, Arlington, MA (US); Hien D. Bui, Lowell, MA (US)

(73) Assignee: RF Micro Devices, Inc., Greensboro, NC (US)

( * ) Notice: Subject to any disclaimer, the term of this patent is extended or adjusted under 35 U.S.C. 154(b) by 35 days.

(21) Appl. No.: 11/549,011

(22) Filed: Oct. 12, 2006

(51) Int. Cl.
*H03F 1/14* (2006.01)

(52) U.S. Cl. .......................................... 330/51; 330/261

(58) Field of Classification Search .................. 370/51, 370/261, 285, 296, 302
See application file for complete search history.

(56) References Cited

U.S. PATENT DOCUMENTS 7,250,814 B2 * 7/2007 Bardsley et al. .............. 330/51
7,265,614 B2 * 9/2007 Chang et al. .................. 330/51
7,315,204 B2 * 1/2008 Seven ........................... 330/51

* cited by examiner

*Primary Examiner*—Henry Choe
(74) *Attorney, Agent, or Firm*—Withrow & Terranova, PLLC

(57) ABSTRACT

The present invention is a parallel RF amplifier circuit that selects between a high power side (HPS) and a low power side (LPS), depending upon output power. A chain matching network couples an LPS output to an HPS output for improved efficiency at lower output power. When the HPS is selected, the LPS output is disabled, and when the LPS is selected, the HPS output is disabled When the HPS is selected, large signal voltage swings from the collector of the HPS amplifier may be multiplied through the chain matching network, and may cause negative voltage swings at the LPS collector, which may degrade linearity and efficiency of the HPS amplifier by driving currents into the disabled LPS amplifier. Therefore, the present invention includes LPS bias circuitry to minimize impacts of negative voltage swings at the LPS output.

20 Claims, 10 Drawing Sheets

RADIO FREQUENCY PARALLEL AMPLIFIER

FIELD OF THE INVENTION

The present invention relates to radio frequency (RF) amplifiers, which are used in RF communications circuitry.

BACKGROUND OF THE INVENTION

Portable battery powered wireless communications devices, such as mobile terminals, cell phones, and the like, often have the ability to transmit information at different output power levels. When receive signal strengths are large, transmitting at lower output power levels can reduce battery consumption, decrease RF radiation exposure, and reduce RF interference. One way to reduce output power levels is to reduce operating voltages at the final stage of a transmitter power amplifier (PA) by using a DC-to-DC converter. DC-to-DC converters have requirements for printed circuit board (PCB) space, cost, and complexity, and may add the potential for spurious signals. An alternate architecture may be a multiple stage amplifier that bypasses certain stages for reduced output power; however, the required bypass circuitry can be somewhat complex. A more effective architecture may be a parallel amplifier circuit including a high power side and a low power side, which are both coupled to one RF output. By selecting the low power side for transmission at lower output power levels, efficiency can be maintained while using a relatively simple architecture.

One challenge of parallel amplifiers may be coupling the high power side to the low power side while preserving proper impedance matching for both sides. One technique is to provide separate impedance matching circuitry for each side and then isolate the two sides from each other using multiple one-quarter wavelength transmission lines on a PCB; however, space constraints may prohibit this technique. Another technique is to use a chain matching network coupled between the outputs of the two sides. One challenge of this technique is that a chain matching network may allow large voltage swings at the output of the low power side when the high power side is selected. These voltage swings may cause anomalous behavior in the low power side. Therefore, a need exists for a disabled power amplifier that can handle large voltage swings at its output.

SUMMARY OF THE INVENTION

The present invention is a parallel RF amplifier circuit that selects between a high power side (HPS) and a low power side (LPS), depending upon output power. A chain matching network couples an LPS output to an HPS output for improved efficiency at lower output power. When the HPS is selected, the LPS output is disabled, and when the LPS is selected, the HPS output is disabled. When the HPS is selected, large signal voltage swings from the collector of the HPS amplifier may be multiplied through the chain matching network, and may cause negative voltage swings at the LPS collector, which may degrade linearity and efficiency of the HPS amplifier by driving currents into the disabled LPS amplifier. Therefore, the present invention includes LPS bias circuitry to minimize the impact of negative voltage swings at the LPS output. Certain embodiments of the LPS bias circuitry may include a bias impedance network to limit the currents due to the large signal swings. Other embodiments of the LPS bias circuitry may include an LPS bias power enable circuit to remove power from specific LPS bias circuitry to limit the currents due to the large signal swings.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a parallel RF amplifier circuit that selects between a high power side (HPS) and a low power side (LPS), depending upon output power. A chain matching network couples an LPS output to an HPS output for improved efficiency at lower output power. When the HPS is selected, the LPS output is disabled, and when the LPS is selected, the HPS output is disabled. When the HPS is selected, large signal voltage swings from the collector of the HPS amplifier may be multiplied through the chain matching network, and may cause negative voltage swings at the LPS collector, which may degrade linearity and efficiency of the HPS amplifier by driving currents into the disabled LPS amplifier. Therefore, the present invention includes LPS bias circuitry to minimize impacts of negative voltage swings at the LPS output. Certain embodiments of the LPS bias circuitry may include a bias impedance network to limit the currents due to the large signal swings. Other embodiments of the LPS bias circuitry may include an LPS bias power enable circuit to remove power from specific LPS bias circuitry to limit the currents due to the large signal swings.

Figure 1A:
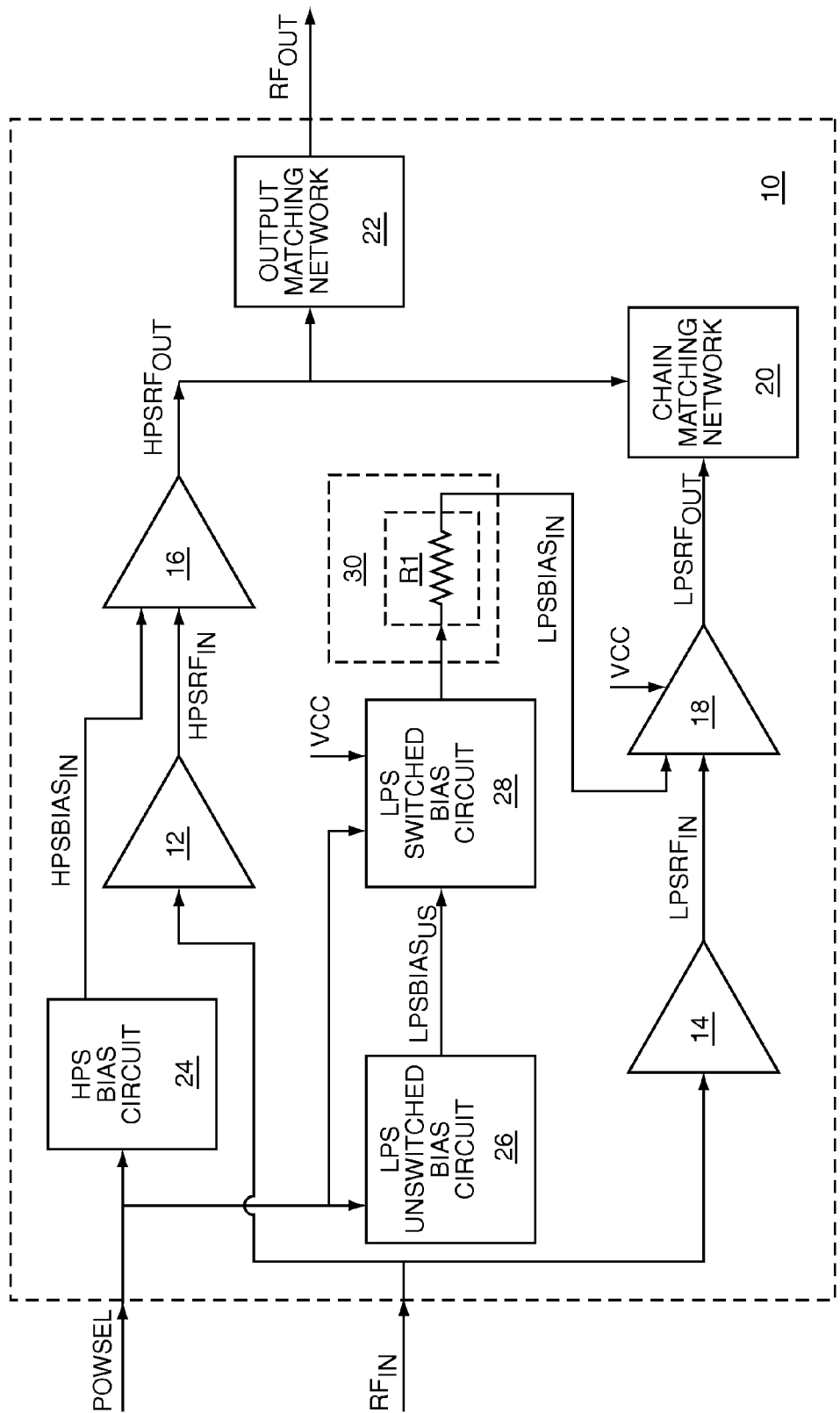
FIG. 1A shows one embodiment of the present invention, which is a parallel RF power amplifier.

One embodiment of the present invention is a parallel RF power amplifier 10 as shown in FIG. 1A. An RF input signal $RF_{IN}$ feeds an HPS driver circuit 12, which may include one or more amplifier stages, and an LPS driver circuit 14, which may include one or more amplifier stages. The HPS driver circuit 12 provides an HPS RF input signal $HPSRF_{IN}$ to an HPS final stage 16, which amplifies the HPS RF input signal $HPSRF_{IN}$ to provide an HPS RF output signal $HPSRF_{OUT}$. The LPS driver circuit 14 provides an LPS RF input signal $LPSRF_{IN}$ to an LPS final stage 18, which amplifies the LPS RF input signal $LPSRF_{IN}$ to provide an LPS RF output signal $LPSRF_{OUT}$. A chain matching network 20 couples the outputs of the HPS and LPS final stages 16, 18. The HPS final stage 16 feeds an output matching network 22 to provide an RF output signal $RF_{OUT}$.

A power select signal POWSEL selects either the HPS or the LPS to provide the RF output signal $RF_{OUT}$ depending on the output power level. When the HPS is selected, the output of the LPS final stage 18 is disabled by removing bias from the LPS final stage 18. When the LPS is selected, the output of the HPS final stage 16 is disabled by removing bias from the HPS final stage 16. POWSEL feeds HPS bias circuitry 24, LPS unswitched bias circuitry 26, and LPS switched bias circuitry 28. The HPS bias circuitry 24 provides an HPS bias signal $HPSBIAS_{IN}$ to the HPS final stage 16. The LPS unswitched bias circuitry 26 provides an LPS unswitched bias signal $LPSBIAS_{US}$ to the LPS switched bias circuitry 28. When the HPS is selected, the LPS unswitched bias signal $LPSBIAS_{US}$ is in an inactive state. The LPS switched bias circuitry 28 provides an LPS bias signal $LPSBIAS_{IN}$ to the LPS final stage 18 through a bias impedance network 30. When the HPS is selected, the LPS switched bias circuitry 28 disables the LPS final stage 18 bias by reducing the bias voltage LPSBIASIN and minimizing currents in the LPS final stage 18. The bias impedance network 30 serves to minimize currents due to large signal swings at the disabled output of the LPS final stage 18.

Figure 1B:
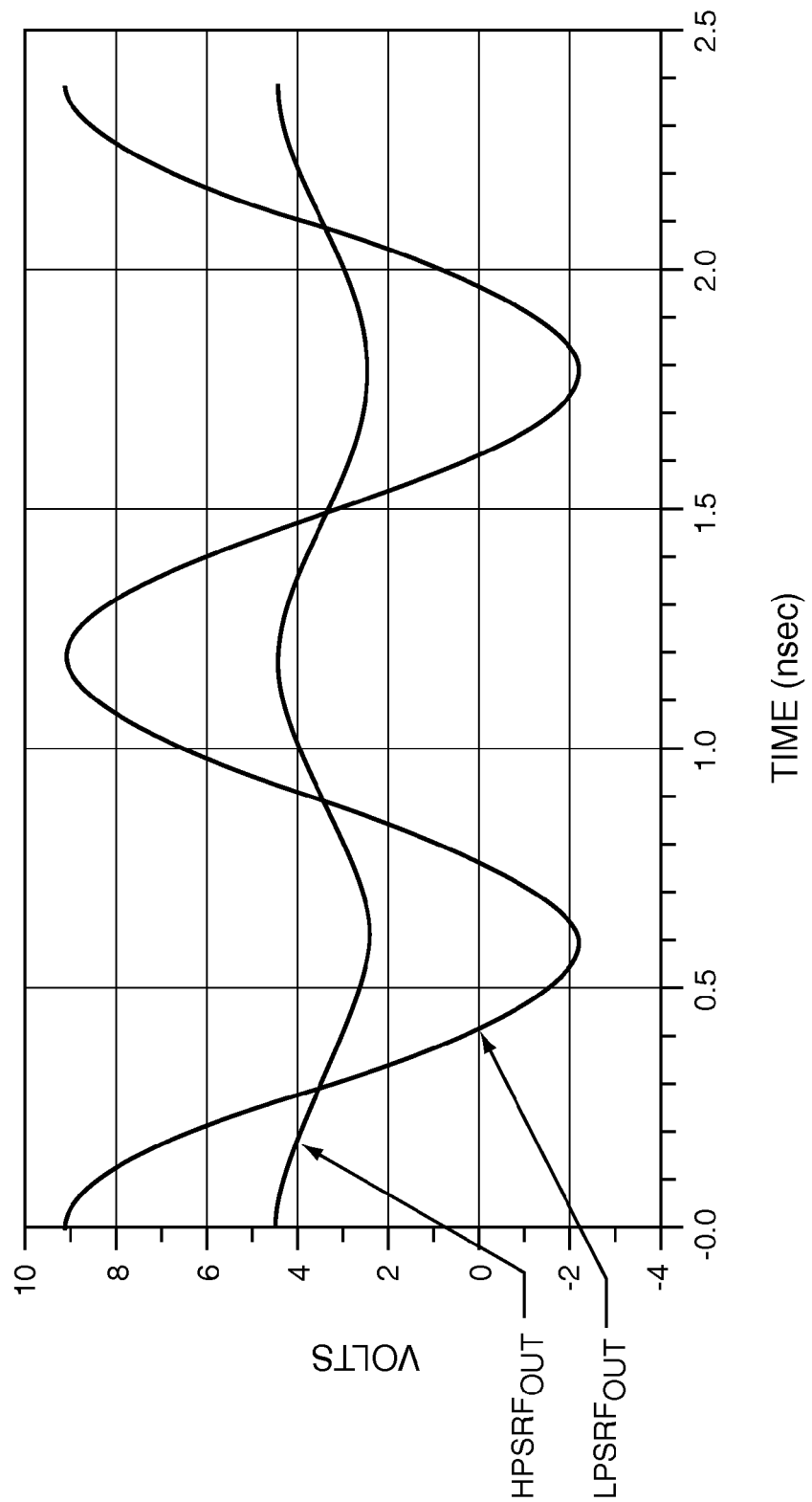
FIG. 1B is a graph showing the relationship between the HPS amplifier output voltage and the LPS amplifier output voltage when the LPS amplifier output is disabled.

Certain embodiments of the present invention may include the bias impedance network 30 without the LPS switched bias circuitry 28. Other embodiments of the present invention may include the LPS switched bias circuitry 28 without the bias impedance network 30. In one embodiment of the present invention, the bias impedance network 30 may include a current limiting resistor R1. The resistance of the current limiting resistor R1 may be greater than 100 ohms. In an exemplary embodiment of the present invention, the resistance of the current limiting resistor R1 may be substantially 1000 ohms, the LPS is selected when the output power level is less than essentially +16 decibel milliwatt (dbm), and the HPS is selected when the output power level is more than essentially +16 dbm. FIG. 1B is a graph showing the relationship between the voltage at the output of the HPS final stage 16 and the voltage at the disabled output of the LPS final stage 18 when the HPS is selected. The chain matching network 20 multiplies the output voltage of the HPS final stage 16 such that negative voltage excursions of negative two volts appear at the disabled output of the LPS final stage 18.

Figure 2:
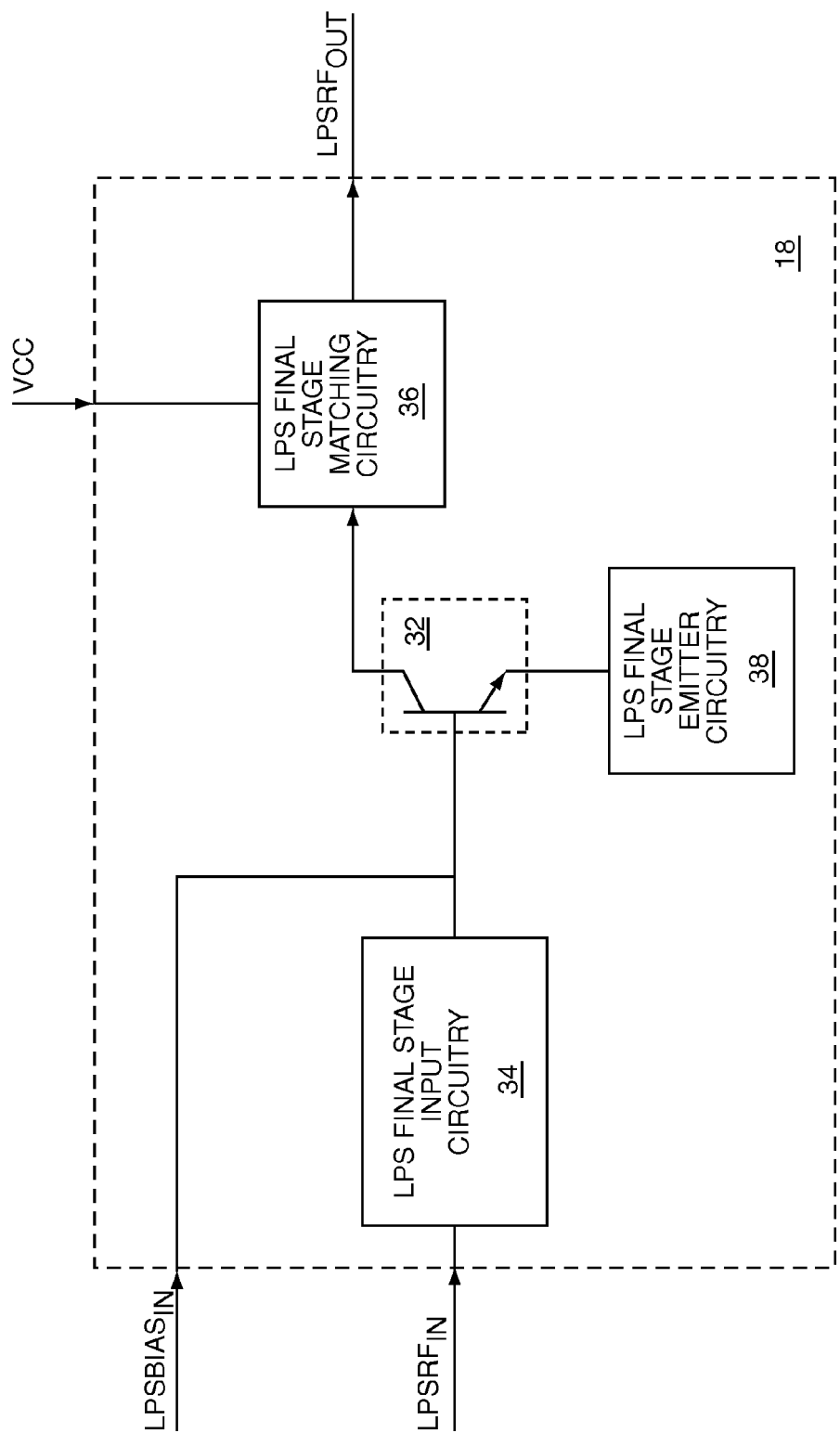
FIG. 2 shows details of the low power side final stage of FIG. 1A.

FIG. 2 shows details of the LPS final stage 18. A bipolar NPN transistor element 32 serves as the active amplification element. LPS final stage input circuitry 34 receives the LPS RF input signal $LPSRF_{IN}$ and feeds the base of the bipolar NPN transistor element 32. The base of the bipolar NPN transistor element 32 also receives the LPS bias signal $LPSBIAS_{IN}$. The collector of the bipolar NPN transistor element 32 is coupled to DC supply voltage VCC and provides the LPS RF output signal $LPSRF_{OUT}$ through LPS final stage matching circuitry 36. The emitter of the bipolar NPN transistor element 32 is connected to LPS final stage emitter circuitry 38. When the HPS is selected, and the LPS final stage 18 is disabled, large voltage swings may appear at the collector of the bipolar NPN transistor element 32, which may forward bias the base-to-collector junction of the bipolar NPN transistor element 32. This forward bias may draw currents from the bias circuitry 26, 28. Therefore, to minimize impedance variations at the output of the LPS final stage 18, which can affect linearity and power consumption, currents from the bias circuitry 26, 28 need to be limited. Some embodiments of the present invention may include a bipolar NPN transistor array for the bipolar NPN transistor element 32.

Figure 3A:
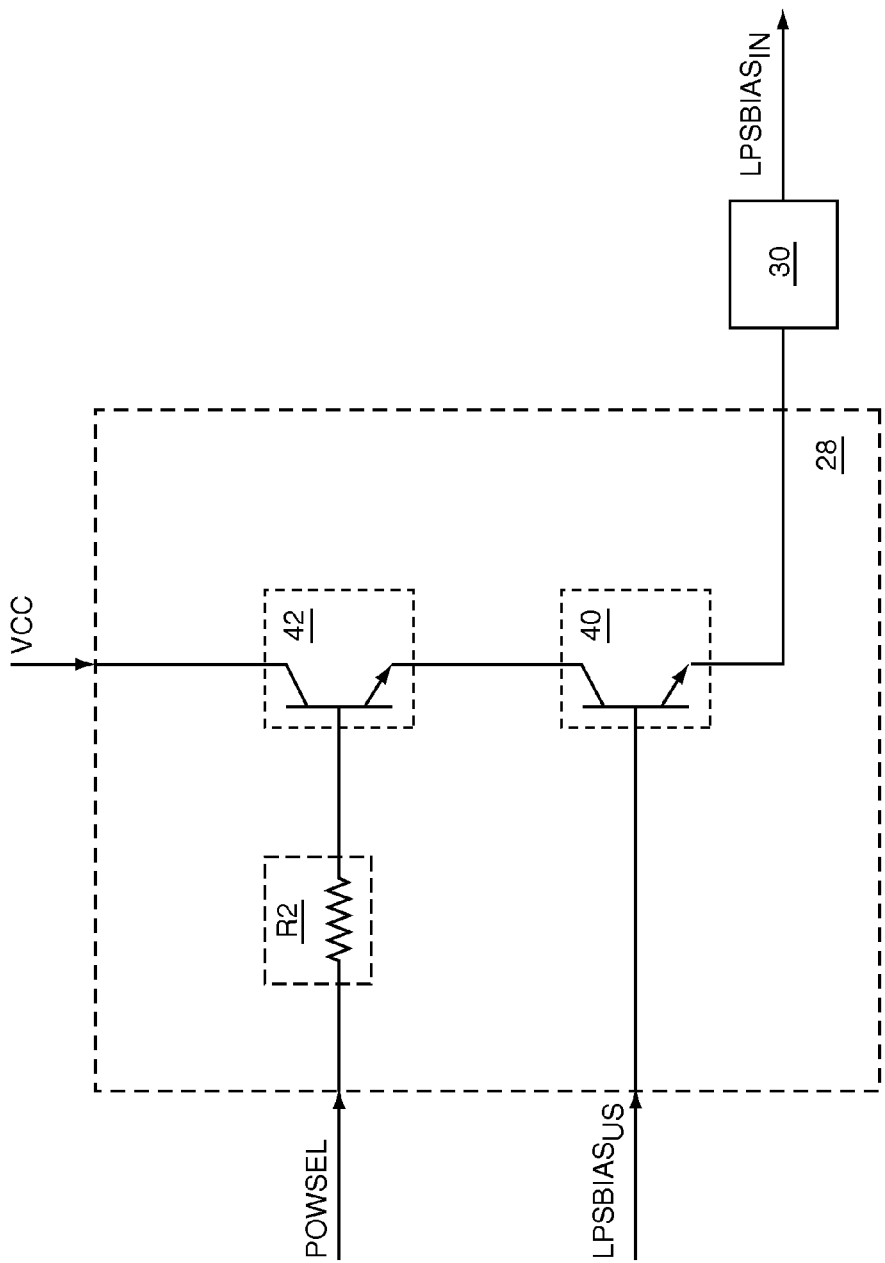
FIG. 3A shows details of the low power side switched bias circuit of FIG. 1A.

FIG. 3A shows details of the LPS switched bias circuitry 28. The base of a bias transistor 40 receives the LPS unswitched bias signal $LPSBIAS_{US}$. The emitter of the bias transistor 40 provides the LPS bias signal $LPSBIAS_{IN}$ through the bias impedance network 30. The collector of the bias transistor 40 is powered up or down from a bias enable transistor 42. The base of the bias enable transistor 42 receives POWSEL through a bias input resistor R2 to either apply or remove power from the bias transistor 40. The collector of the bias enable transistor 42 is coupled to VCC. The emitter of the bias enable transistor 42 applies power and is coupled to the collector of the bias transistor 40.

Figure 3B:
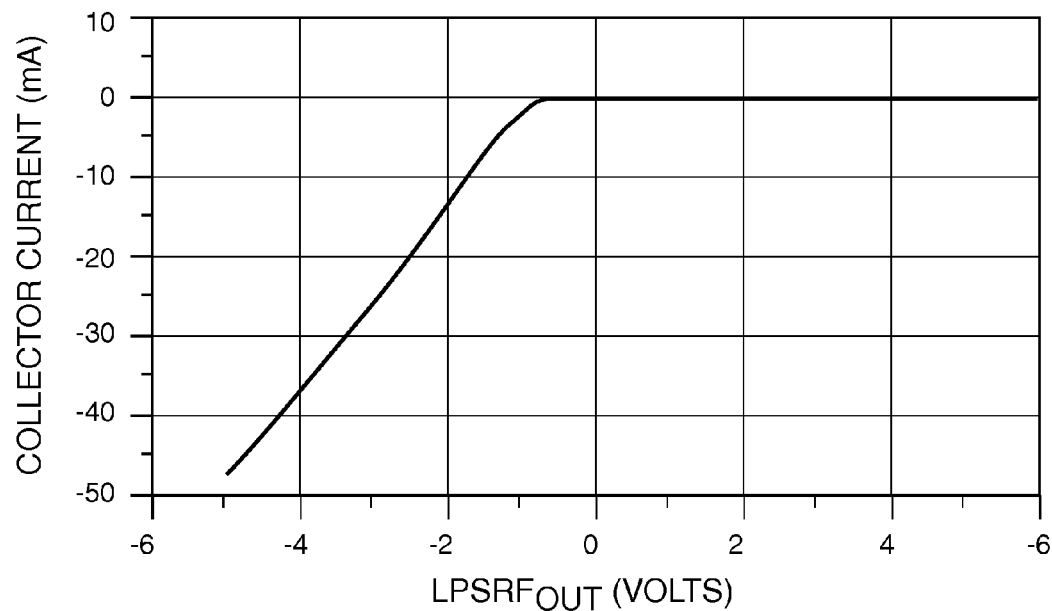
FIG. 3B shows collector currents that may flow into the output of the disabled LPS in the presence of large voltage swings without using the present invention.
Figure 3C:
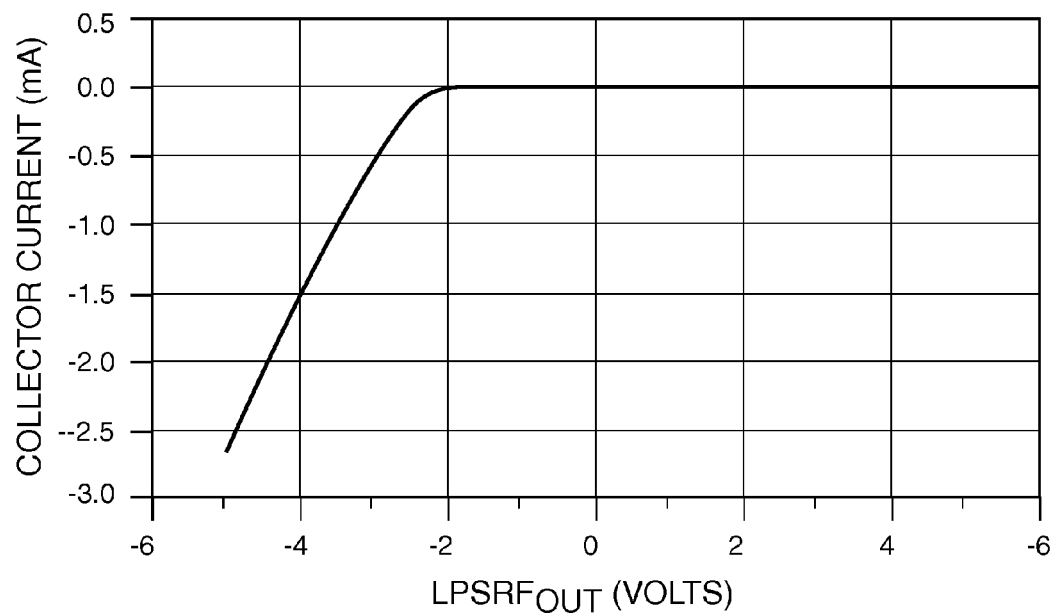
FIG. 3C shows collector currents that may flow into the output of the disabled LPS in the presence of large voltage swings while using the present invention.

FIG. 3B is a graph showing the collector current that may flow into the collector of the bipolar NPN transistor element 32 in the presence of large voltage swings without using the present invention to limit the collector current. When the voltage swings to negative two volts, the resulting collector current is about negative 13 milliamps. FIG. 3C is a graph showing the collector current that may flow into the collector of the bipolar NPN transistor element 32 in the presence of large voltage swings while using both the current limiting resistor R1 and LPS switched bias circuitry 28. When the voltage swings to negative two volts, the resulting collector current is about zero, which provides proper operation of the parallel RF power amplifier 10.

Figure 4:
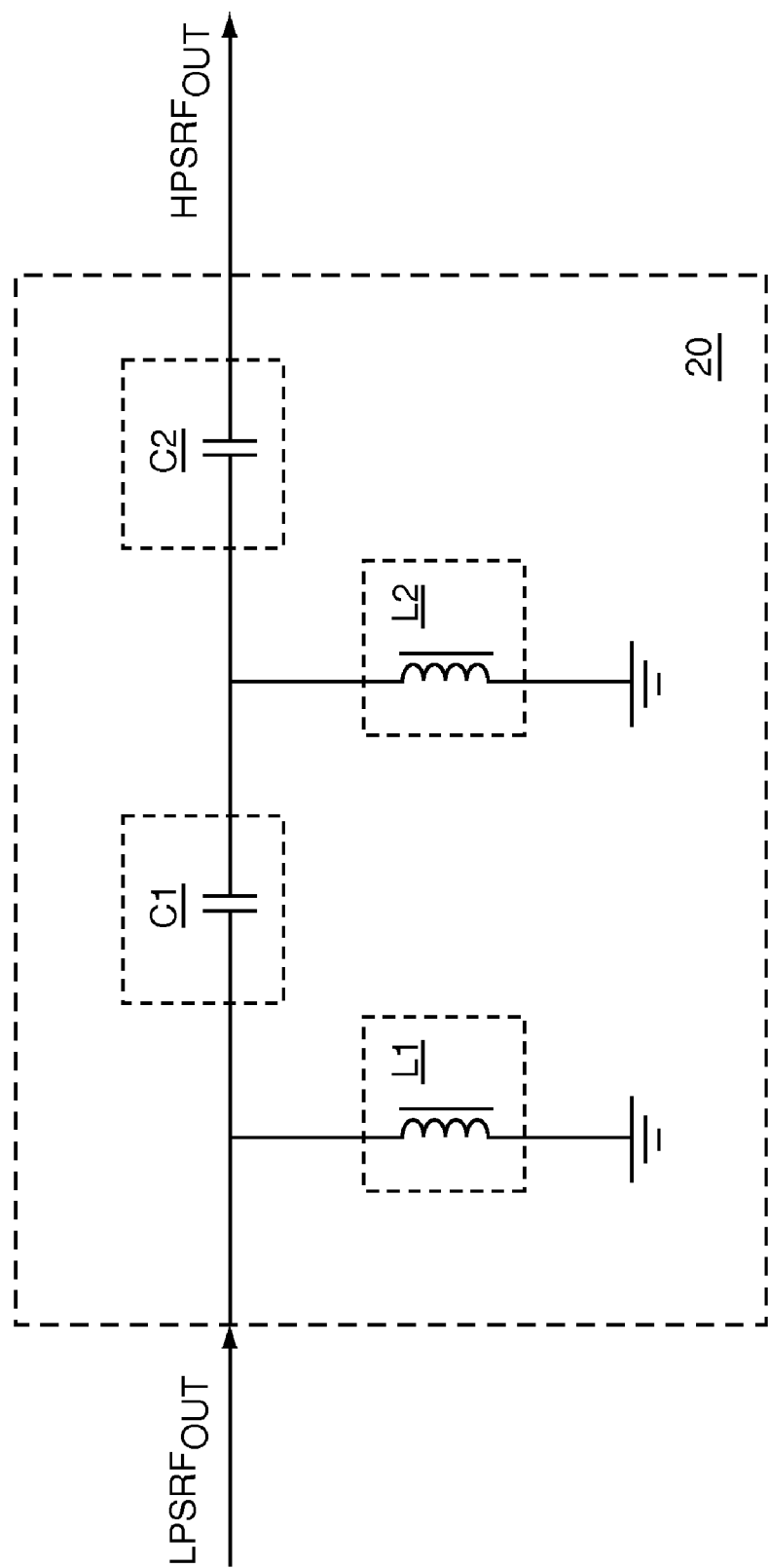
FIG. 4 shows a first embodiment of the chain matching network of FIG. 1A.

FIG. 4 shows a first embodiment of the chain matching network 20. A first capacitive element C1 is coupled between a first inductive element L1 and a second inductive element L2. The junction of the first capacitive element C1 and the first inductive element L1 receives the LPS RF output signal $LPSRF_{OUT}$. The first inductive element L1 is also coupled to ground. The junction of the first capacitive element C1 and the second inductive element L2 is coupled to a second capacitive element C2. The second inductive element L2 is also coupled to ground. The second capacitive element C2 provides the HPS RF output signal $HPSRF_{OUT}$ when the LPS is selected.

Figure 5:
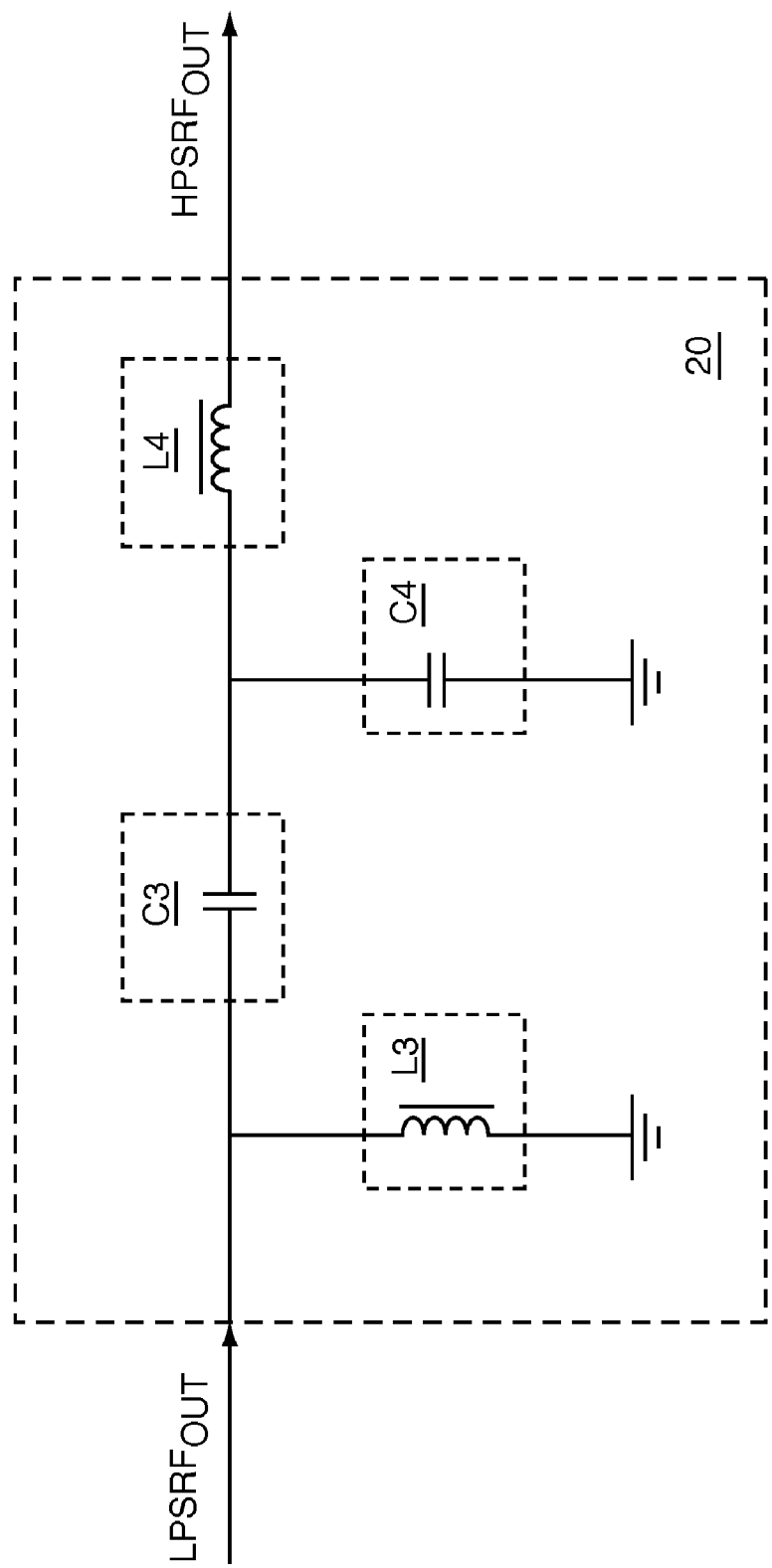
FIG. 5 shows a second embodiment of the chain matching network of FIG. 1A.

FIG. 5 shows a second embodiment of the chain matching network 20. A third capacitive element C3 is coupled between a third inductive element L3 and a fourth capacitive element C4. The junction of the third capacitive element C3 and the third inductive element L3 receives the LPS RF output signal $LPSRF_{OUT}$. The third inductive element L3 is also coupled to ground. The junction of the third capacitive element C3 and the fourth capacitive element C4 is coupled to a fourth inductive element L4. The fourth capacitive element C4 is also coupled to ground. The fourth inductive element L4 provides the HPS RF output signal $HPSRF_{OUT}$ when the LPS is selected.

Figure 6:
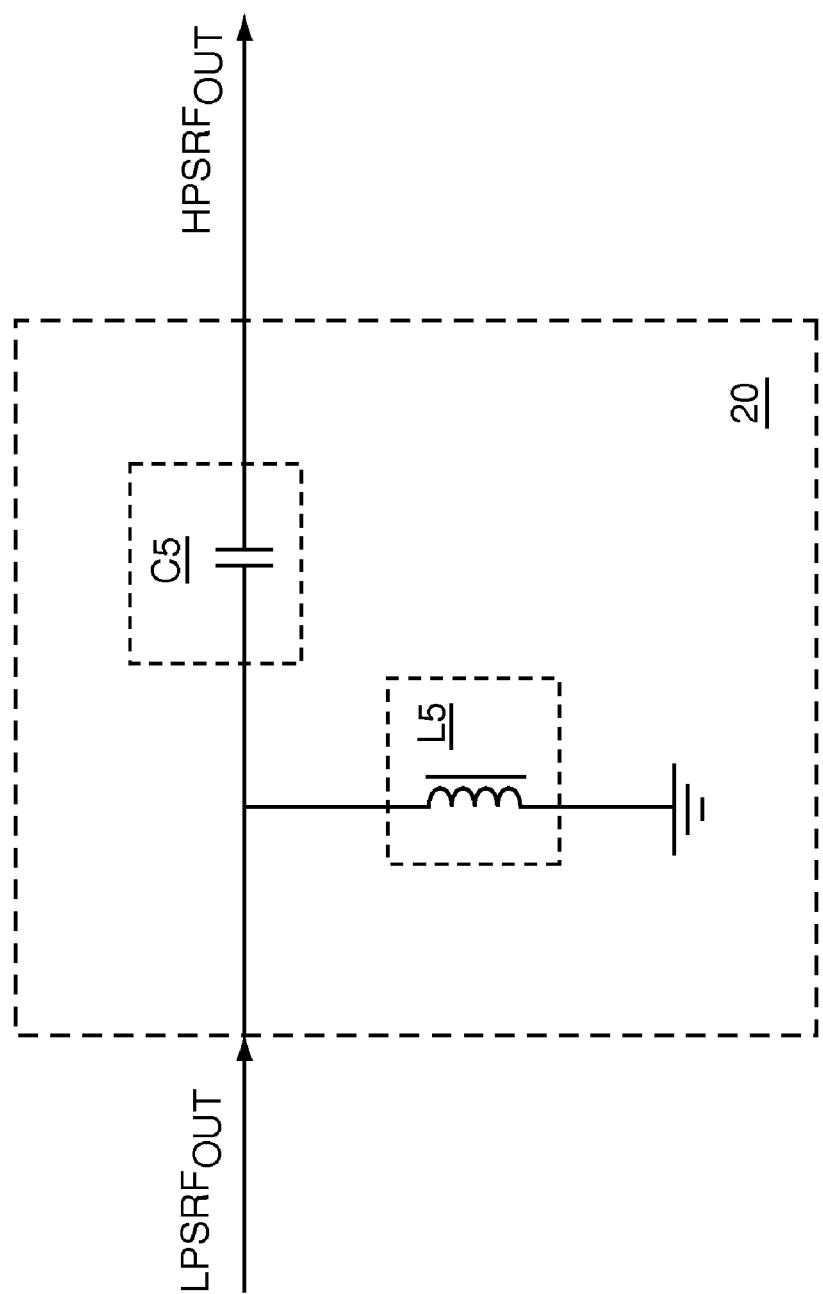
FIG. 6 shows a third embodiment of the chain matching network of FIG. 1A.

FIG. 6 shows a third embodiment of the chain matching network 20. A fifth capacitive element C5 is coupled to a fifth inductive element L5. The junction of the fifth capacitive element C5 and the fifth inductive element L5 receives the LPS RF output signal $LPSRF_{OUT}$. The fifth inductive element L5 is also coupled to ground. The fifth capacitive element C5 provides the HPS RF output signal $HPSRF_{OUT}$ when the LPS is selected.

Figure 7:
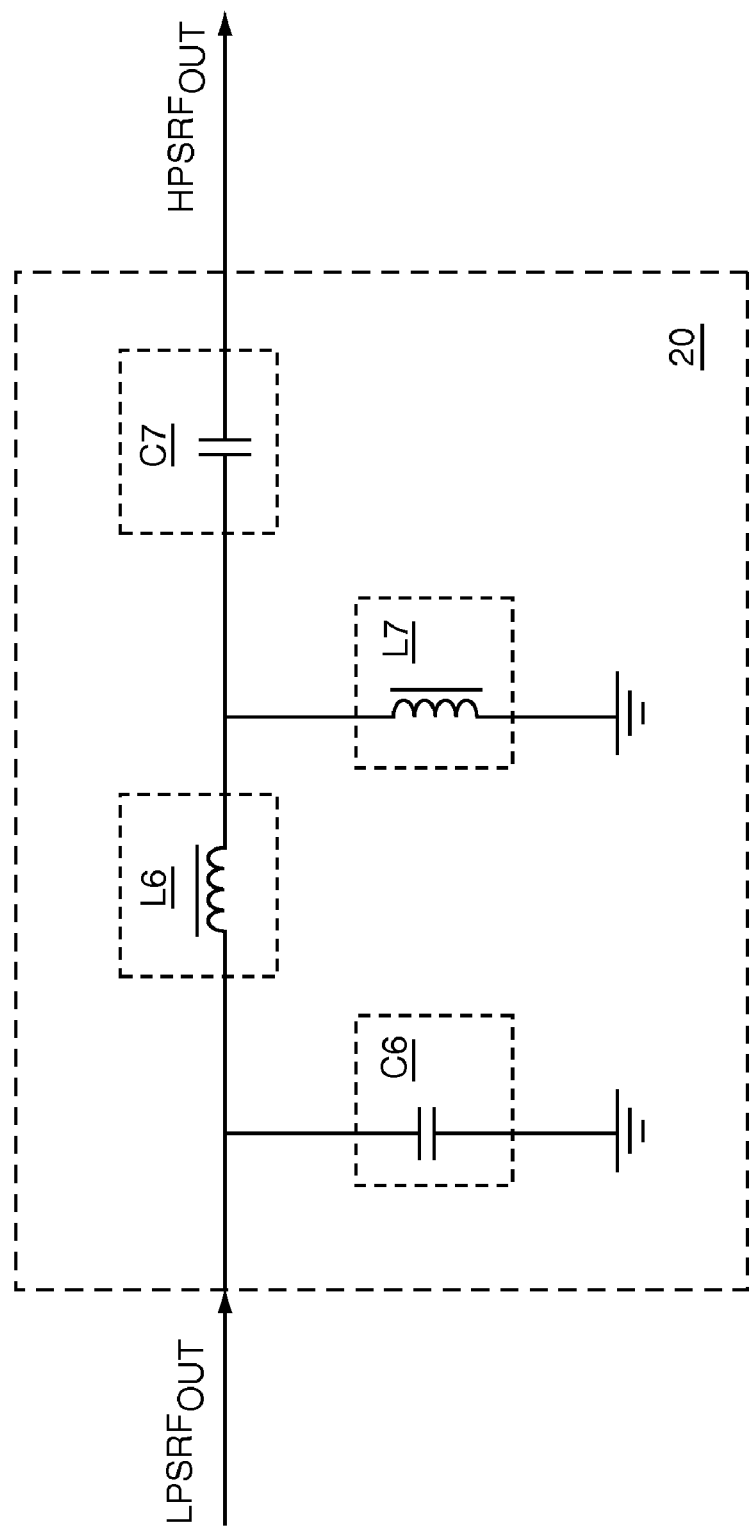
FIG. 7 shows a fourth embodiment of the chain matching network of FIG. 1A.

FIG. 7 shows a fourth embodiment of the chain matching network 20. A sixth inductive element L6 is coupled between a sixth capacitive element C6 and a seventh inductive element L7. The junction of the sixth capacitive element C6 and the sixth inductive element L6 receives the LPS RF output signal $LPSRF_{OUT}$. The sixth capacitive element C6 is also coupled to ground. The junction of the sixth inductive element L6 and the seventh inductive element L7 is coupled to a seventh capacitive element C7. The seventh inductive element L7 is also coupled to ground. The seventh capacitive element C7 provides the HPS RF output signal $HPSRF_{OUT}$ when the LPS is selected. The chain matching network 20 provides a proper impedance for the output of the LPS final stage 18 when the LPS is selected, and a proper impedance for the output of the HPS final stage 16 when the HPS is selected.

Figure 8:
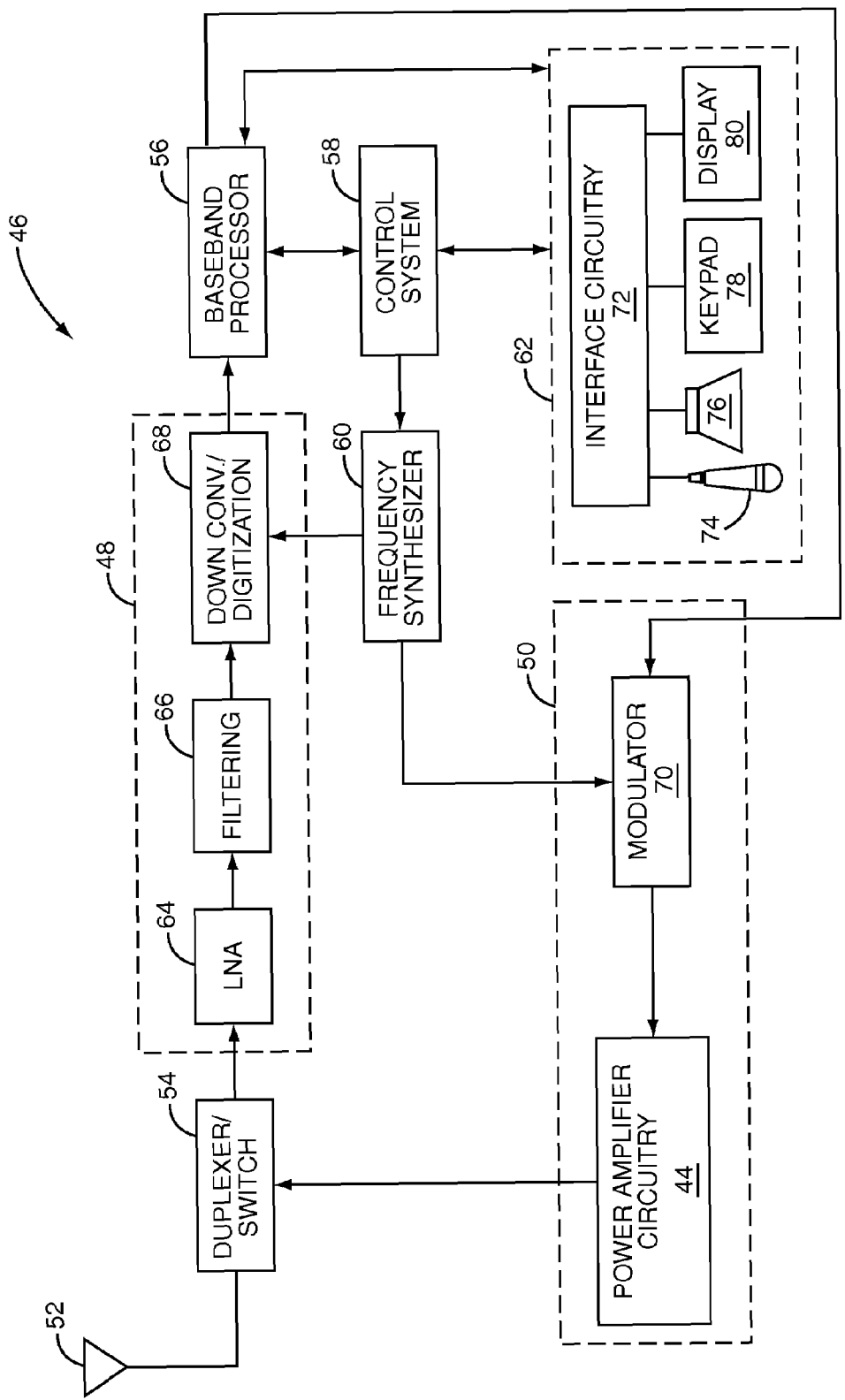
FIG. 8 shows an application example of the present invention used in a mobile terminal.

An application example of a parallel RF power amplifier is its use in power amplifier circuitry 44 in a mobile terminal 46. The basic architecture of the mobile terminal 46 is represented in FIG. 8 and may include a receiver front end 48, a radio frequency transmitter section 50, an antenna 52, a duplexer or switch 54, a baseband processor 56, a control system 58, a frequency synthesizer 60, and an interface 62. The receiver front end 48 receives information bearing radio frequency signals from one or more remote transmitters provided by a base station. A low noise amplifier (LNA) 64 amplifies the signal. A filter circuit 66 minimizes broadband interference in the received signal, while downconversion and digitization circuitry 68 downconverts the filtered, received signal to an intermediate or baseband frequency signal, which is then digitized into one or more digital streams. The receiver front end 48 typically uses one or more mixing frequencies generated by the frequency synthesizer 60. The baseband processor 56 processes the digitized received signal to extract the information or data bits conveyed in the received signal. This processing typically comprises demodulation, decoding, and error correction operations. As such, the baseband processor 56 is generally implemented in one or more digital signal processors (DSPs).

On the transmit side, the baseband processor 56 receives digitized data, which may represent voice, data, or control information, from the control system 58, which it encodes for transmission. The encoded data is output to the transmitter 50, where it is used by a modulator 70 to modulate a carrier signal that is at a desired transmit frequency. The power amplifier circuitry 44 selects either the HPS or the LPS, depending on the output power level, and amplifies the modulated carrier signal to a level appropriate for transmission. The power amplifier circuitry 44 delivers the amplified and modulated carrier signal to the antenna 52 through the duplexer or switch 54.

A user may interact with the mobile terminal 46 via the interface 62, which may include interface circuitry 72 associated with a microphone 74, a speaker 76, a keypad 78, and a display 80. The interface circuitry 72 typically includes analog-to-digital converters, digital-to-analog converters, amplifiers, and the like. Additionally, it may include a voice encoder/decoder, in which case it may communicate directly with the baseband processor 56. The microphone 74 will typically convert audio input, such as the user's voice, into an electrical signal, which is then digitized and passed directly or indirectly to the baseband processor 56. Audio information encoded in the received signal is recovered by the baseband processor 56, and converted by the interface circuitry 72 into an analog signal suitable for driving the speaker 76. The keypad 78 and display 80 enable the user to interact with the mobile terminal 46, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) amplifier circuit comprising:
 a high power final stage comprising a high power RF output and a high power bias input;
 a low power final stage comprising a low power RF output and a low power bias input;
 a chain matching network coupled between the high power RF output and the low power RF output;
 a bias circuit comprising a low power bias output and a high power bias output coupled to the high power bias input; and
 a current limiting circuit coupled between the low power bias output and the low power bias input,
wherein the high power bias output provides a direct current (DC) bias signal to enable the high power final stage, the low power bias output provides a DC bias signal at essentially zero volts to disable the low power final stage, and the current limiting circuit limits currents that may flow as a result of negative voltages at the low power RF output when the low power final stage is disabled.

2. The RF amplifier circuit of claim 1 wherein the current limiting circuit further comprises a first resistive element, wherein a resistance of the first resistive element is greater than 100 ohms.

3. The RF amplifier circuit of claim 2 wherein the resistance of the first resistive element is substantially 1000 ohms.

4. The RF amplifier circuit of claim 1 wherein the low power final stage further comprises a bipolar NPN transistor element comprising a base and a collector, wherein base-to-collector current is limited by the current limiting circuit.

5. The RF amplifier circuit of claim 1 wherein the low power final stage further comprises a bipolar NPN transistor array comprising a base and a collector, wherein base-to-collector current is limited by the current limiting circuit.

6. The RF amplifier circuit of claim 1 wherein the chain matching network further comprises:
 a first inductive element coupled to the low power RF output;
 a first capacitive element coupled to the low power RF output;
 a second inductive element coupled to the first capacitive element; and
 a second capacitive element coupled between the first capacitive element and the high power RF output.

7. The RF amplifier circuit of claim 1 wherein the chain matching network further comprises:
a first inductive element coupled to the low power RF output;
a first capacitive element coupled to the low power RF output;
a second capacitive element coupled to the first capacitive element; and
a second inductive element coupled between the first capacitive element and the high power RF output.

8. The RF amplifier circuit of claim 1 wherein the chain matching network further comprises:
a first inductive element coupled to the low power RF output; and
a first capacitive element coupled between the low power RF output and the high power RF output.

9. The RF amplifier circuit of claim 1 wherein the chain matching network further comprises:
a first inductive element coupled to the low power RF output;
a first capacitive element coupled to the low power RF output;
a second inductive element coupled to the first inductive element; and
a second capacitive element coupled between the first inductive element and the high power RF output.

10. A radio frequency (RF) amplifier circuit comprising:
a high power final stage comprising a high power RF output and a high power bias input;
a low power final stage comprising a low power RF output and a low power bias input;
a chain matching network coupled between the high power RF output and the low power RF output;
a bias circuit comprising a low power bias output coupled to the low power bias input, and a high power bias output coupled to the high power bias input; and
a bias enable circuit adapted to provide a supply voltage to the bias circuit,
wherein the high power bias output provides a direct current (DC) bias signal to enable the high power final stage, the low power bias output provides a DC bias signal at essentially zero volts to disable the low power final stage, and the bias enable circuit removes the supply voltage to the bias circuit to limit currents that may flow as a result of negative voltages at the low power RF output when the low power final stage is disabled.

11. The RF amplifier circuit of claim 10 wherein the bias circuit further comprises a bipolar NPN transistor element comprising an emitter and a collector, wherein the emitter is coupled to the low power bias input, and a voltage to the collector is essentially zero volts when the low power final stage is disabled.

12. The RF amplifier circuit of claim 10 wherein the bias enable circuit further comprises a bipolar NPN transistor element comprising an emitter, wherein the emitter provides the supply voltage to the bias circuit, and the emitter is essentially zero volts when the low power final stage is disabled.

13. The RF amplifier circuit of claim 10 wherein the low power final stage further comprises a bipolar NPN transistor element comprising a base and a collector, wherein base-to-collector current is limited when the low power final stage is disabled.

14. The RF amplifier circuit of claim 10 wherein the chain matching network further comprises:
a first inductive element coupled to the low power RF output;
a first capacitive element coupled to the low power RF output;
a second inductive element coupled to the first capacitive element; and
a second capacitive element coupled between the first capacitive element and the high power RF output.

15. The RF amplifier circuit of claim 10 wherein the chain matching network further comprises:
a first inductive element coupled to the low power RF output;
a first capacitive element coupled to the low power RF output;
a second capacitive element coupled to the first capacitive element; and
a second inductive element coupled between the first capacitive element and the high power RF output.

16. The RF amplifier circuit of claim 10 wherein the chain matching network further comprises:
a first inductive element coupled to the low power RF output; and
a first capacitive element coupled between the low power RF output and the high power RF output.

17. The RF amplifier circuit of claim 10 wherein the chain matching network further comprises:
a first inductive element coupled to the low power RF output;
a first capacitive element coupled to the low power RF output;
a second inductive element coupled to the first inductive element; and
a second capacitive element coupled between the first inductive element and the high power RF output.

18. The RF amplifier circuit of claim 10 further comprising a current limiting circuit coupled between the low power bias output and the low power bias input, wherein the current limiting circuit limits currents that may flow as a result of negative voltages at the low power RF output when the low power final stage is disabled.

19. The RF amplifier circuit of claim 18 wherein the current limiting circuit further comprises a first resistive element, wherein a resistance of the first resistive element is greater than 100 ohms.

20. The RF amplifier circuit of claim 19 wherein a resistance of the first resistive element is substantially 1000 ohms, the low power RF output is disabled when an output power from the RF amplifier circuit is essentially greater than +16 decibel milliwatt (dbm), and the high power RF output is disabled when the output power from the RF amplifier circuit is essentially less than +16 dbm.

* * * * *